United States Patent [19]

Shibata

[11] Patent Number: 5,434,747
[45] Date of Patent: Jul. 18, 1995

[54] PHOTOELECTRIC TRANSDUCER

[75] Inventor: Sueji Shibata, Tokyo, Japan

[73] Assignee: Yamaichi Electronics Co., Ltd., Tokyo, Japan

[21] Appl. No.: 219,375

[22] Filed: Mar. 29, 1994

[30] Foreign Application Priority Data

Mar. 30, 1993 [JP] Japan .................................. 5-095311

[51] Int. Cl.⁶ ............................................ H05K 9/00
[52] U.S. Cl. ............................ 361/753; 174/35 GC; 174/35 R; 174/51; 333/12; 439/607
[58] Field of Search ............ 174/35 R, 35 GC, 35 TS, 174/51; 250/515.1; 257/659, 728; 330/68; 331/67; 333/12, 246, 247; 334/85; 343/841; 358/255; 361/753, 816, 818, 814; 439/108, 109, 607, 609; 455/89, 90

[56] References Cited

U.S. PATENT DOCUMENTS

| | | | |
|---|---|---|---|
| 4,494,095 | 1/1985 | Noji et al. | 361/818 |
| 4,649,461 | 3/1987 | Matsuta | 361/818 |
| 4,677,396 | 6/1987 | Cruz et al. | 361/818 |
| 4,725,920 | 2/1988 | Ijichi et al. | 361/818 |
| 4,841,414 | 6/1989 | Hibino et al. | 361/818 |
| 5,379,185 | 1/1995 | Griffin et al. | 361/709 |

FOREIGN PATENT DOCUMENTS 3-6099  1/1991  Japan .................................. 361/818

Primary Examiner—Leo P. Picard
Assistant Examiner—Donald A. Sparks
Attorney, Agent, or Firm—Wenderoth, Lind & Ponack

[57] ABSTRACT

A photoelectric transducer includes a conductive case having an optical connector receptacle and circuit board forming a photoelectric transducer circuit. Conductive stands are erected from the bottom of the conductive case to bridge-support the opposite ends of the circuit board. The stands have first grounding terminals connected to grounding lines of the circuit board and also second grounding terminals penetrating the conductive case for outward projection. The positioning and assembling of the circuit board can be simplified, a shield structure can be readily formed, and it is ensured that the connection terminals are out of contact with the conductive case. With this structure, the photoelectric transducer can be rendered compact.

2 Claims, 6 Drawing Sheets

PHOTOELECTRIC TRANSDUCER

BACKGROUND OF THE INVENTION

1. Field of the Invention

This invention relates to a photoelectric transducer connecting an optical communication line and an electric communication line.

2. Prior Art

FIG. 13 shows a prior art photoelectric transducer. The photoelectric transducer comprises a conductive case B having an optical connector receptacle A and accommodating a circuit board C forming a photoelectric transducer circuit. The circuit board C has a large number of connection terminals D inserted in its through-holes and connected to it, these connection terminals D loosely penetrating small holes F formed in the bottom of the conductive case B to the outside.

In this photoelectric transducer, edges of the circuit board C are soldered to the conductive case B, or an insulating spacer E interposed between the circuit board C and the conductive case B is secured to the circuit board C by bonding it with an adhesive to the conductive case B.

When it is intended to reduce the photoelectric transducer size, however, it is not easy to bond and assemble the circuit board C and conductive case C by accurately positioning and inserting the connection terminals D of the circuit board C in the small holes F provided in the bottom of the conductive case B. Frequently, when bonding the circuit board C, the connection terminals D are positionally deviated to be short-circuited to the edges defining the small holes F of the conductive case B. Besides, there are other problems such as the necessity of time for the hardening of the adhesive for securing the spacer E and the circuit board C and difficulty of subsequent removal of the circuit board C.

SUMMARY OF THE INVENTION

The invention intends to solve the above problems, and it is an object of the invention to improve positioning and assembling of the circuit board and also permit an adequate shield structure to be readily obtained.

To attain this object, according to the invention the opposite ends of the circuit board forming the photoelectric transducer circuit are bridge-support by respective conductive stands, which are erected from the bottom of the conductive case having an optical connector receptacle, the conductive stands having first grounding terminals connected to grounding lines of the circuit board and also having second grounding terminals penetrating the conductive case for outward projection.

Further, according to the invention an insulating spacer is provided between the circuit board and the conductive case such that it is mounted and supported between the paired conductive stands. The spacer has alignment holes, through which stems of connection terminals of the circuit board are inserted.

With the second grounding terminals of the conductive stands, which bridge-support the circuit board, penetrating the conductive case holes for outward projection, the grounding and the assembling by positioning can be readily obtained with the first grounding terminals connected to the grounding lines of the circuit board while providing a structure in which the circuit board is bridge-supported by the conductive stands erected from the bottom of the conductive case.

Further, it is possible to effectively prevent the positional deviation of the circuit board and ensure that the connection terminals of the circuit board are out of contact with the conductive case in adequately coping with the size reduction of the photoelectric transducer.

Further, with the second grounding terminals of the conductive stands, which penetrate the conductive case holes for outward projection, connected to grounding lines of an external circuit board, the grounding lines of the internal circuit board and the conductive case are grounded via the conductive stands, thus permitting ready formation of a shield structure as well as permitting the simplification of the assembling by positioning.

Furthermore, with the mounting and supporting, between the paired conductive stands, of the insulating spacer provided between the circuit board and the conductive case, the spacer can be reliably positioned by the erected stands. In addition, with the alignment holes formed in the spacer, the connection terminals of the circuit board can be reliably aligned to permit more reliable prevention of the contact of the connection terminals and the conductive case with one another.

DETAILED DESCRIPTION OF THE PREFERRED EMBODIMENTS

Figure 1:
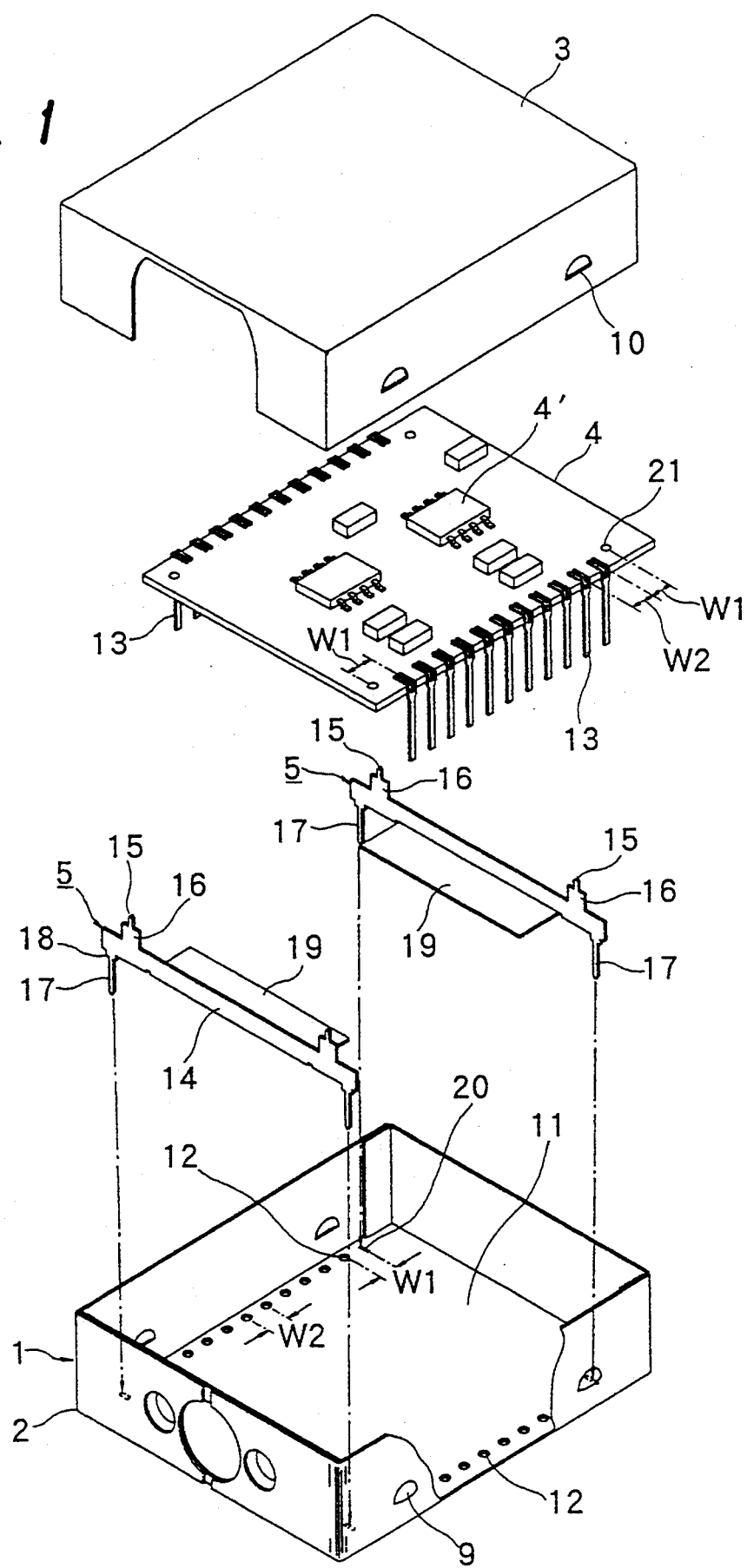
FIG. 1 is an exploded perspective view showing an embodiment of the photoelectric transducer according to the invention.
Figure 2:
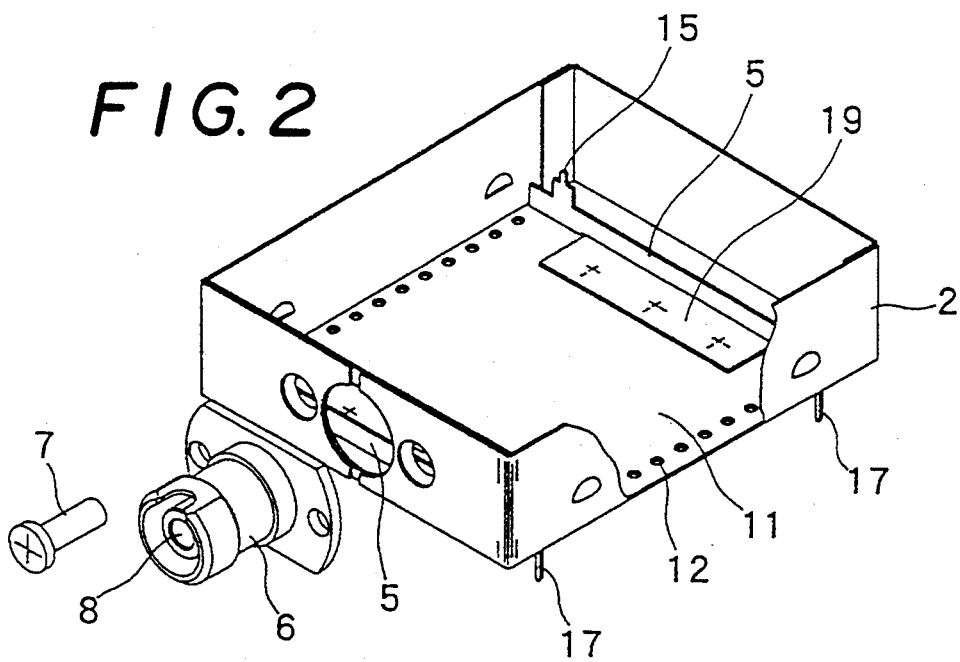
FIG. 2 is a perspective view, partly broken away, showing an accommodation case with conductive stands erected thereon and an optical connector receptacle of the embodiment.
Figure 3:
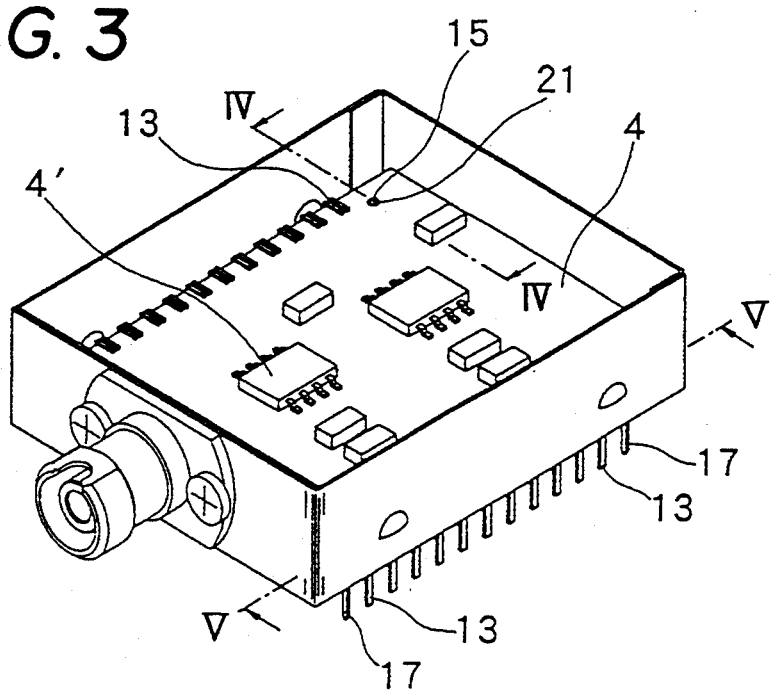
FIG. 3 is a perspective view showing the accommodation case with a circuit board accommodated therein.

An embodiment of the invention will now be described in detail with reference to FIGS. 1 to 12. FIG. 1 shows the embodiment of the photoelectric transducer in a disassembled state. The photoelectric transducer comprises a conductive case 1, which includes an accommodation case 2 and a cover case 3 of the same shape, these cases 2 and 3 being made of a metal. In the accommodation case 2, a circuit board 4 forming a photoelectric transducer circuit is bridge-supported by a pair of conductive stands 5. Further, as shown in FIGS. 2 and 3, an optical connector receptacle 6 is mounted by screws 7 on the outer surface of one side wall of the accommodation case 2, and a photoelectric connector in the optical connector receptacle 6 is connected to the circuit board 4. As shown in FIG. 7, the accommodation and cover cases 2 and 3 are fitted and assembled together to form the conductive case 1, which is in a sealed state, by inserting engagement pawls provided on side walls of the accommodation case 2 in engagement holes 10 provided in side walls of the cover case 3.

The bottom 11 of the accommodation case 2 of the conductive case 1, has a large number of terminal insertion holes 12 which are formed adjacent and along two or four edges of the bottom 11. The circuit board 4 has connection terminals 13, which correspond in number to the terminal insertion holes 12 and are formed in rows extending adjacent and along two or four edges of the board. These connection terminals 12 are inserted through the terminal insertion holes in an out-of-contact state relative to the bottom 11 such that they project outward from the bottom 11.

The conductive stands 5 serve as connecting means forming a grounding structure as well as being means for bridge-supporting opposite edges of the circuit board 4. As shown clearly in FIG. 1, each conductive stand 5 is formed from a conductive sheet by stamping. The conductive stand 5 has an elongate connecting portion 14, which extends upright relative to the bottom 11 when the conductive stand 5 is assembled. Two first grounding terminals 15 extend upward from the connecting portion 14 such that they are slightly spaced apart from the opposite ends of the connecting portion 14. Each first grounding terminal 15 has an increased width stem portion as a support portion 16. Two second grounding terminals 17 extend downward from the connection portion 14 adjacent the opposite ends thereof. Each second grounding terminal 17 has an increased width stem portion as a stand-off portion 18. The conductive stand 5 further has a mounting portion 19, which extends inward and substantially horizontally from the lower edge of the connecting portion 14.

The bottom 11 of the conductive case 11 further has groove-like stand mounting holes 20 formed adjacent the opposite ends of the rows of the terminal insertion holes 12 which are formed at a predetermined pitch. The second grounding terminals 17 of the conductive stands 5 are inserted through the stand mounting holes 20 such that they project outward and also such that the stand-off portions 18 partly project outward. As shown in FIG. 2, the mounting portion 19 of each conductive stand 5 is set on and bonded by spot-welding or the like to the inner surface of the bottom 11 of the accommodation case 2. In this way, the pair conductive stands 5 are erected on the bottom 11 of the conductive case 1 at predetermined positions such that they extend along two opposite sides of the bottom 11. The stand mounting holes 20 are formed at a uniform distance W1 from each end of each row of the terminal insertion holes 12. For instance, the distance W1 is set to be equal to the distance W2 between adjacent terminal insertion holes 12.

The conductive stands 5 are made electrically conductive with the conductive case 1 by inserting the second grounding terminals through the bottom 11. The conduction of the conductive case 1 and each conductive stand 5 is also obtained by bonding the connecting portion 14 to the bottom 11 of the case. The conduction is further obtained by mounting the mounting portion 19 on the bottom as in this embodiment. In this case, the second grounding terminals need not be in contact with the edges of the case defining the stand mounting holes 20.

The four first grounding terminals 15 of the two conductive stands 5 are inserted through board mounting holes 21 formed in the circuit board 4 adjacent the opposite ends of the rows of the connection terminals 13. At this time, the circuit board 4 is supported horizontally by the shoulders 5 of the support portions 16. In this state, the first grounding terminals are soldered to grinding lines on the circuit board 4. With the first grounding terminals 15 inserted in the board mounting holes 21, the position of accommodation of the circuit board 4 with respect to the accommodation case 2 is determined accurately via the conductive stands 5. Each of the board-mounting holes 21 is spaced apart a uniform distance W1 from each end of each row of the connection terminals 13. For instance, the distance W1 is set to be equal to the distance W2 between adjacent connection terminals 13.

Figure 6:
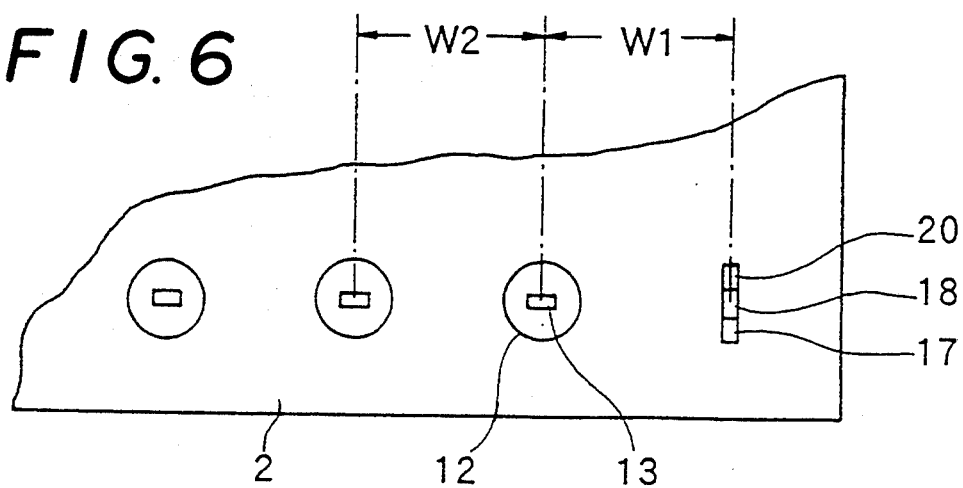
FIG. 6 is a fragmentary rear view showing part of the accommodation case accommodating and supporting the circuit board.
Figure 7:
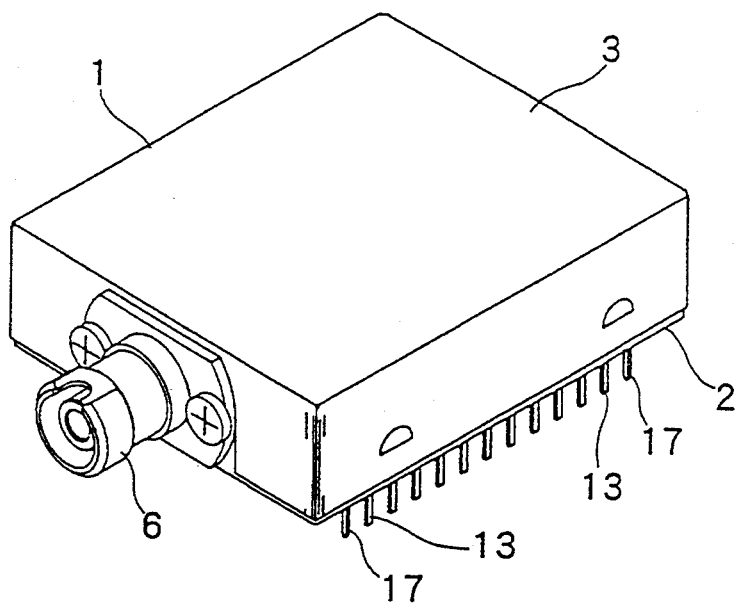
FIG. 7 is a perspective view showing the embodiment of the photoelectric transducer in the assembled state.

Thus, as shown in FIG. 6, the number of connection terminals 13 of the circuit board 4 are held in the terminal insertion holes 12 such that they are out of contact with the accommodation case 2.

As shown in FIG. 7, the conductive case 1 in the sealed state is formed by fitting the cover case 3 on the accommodation case 2. The photoelectric transducer is thus formed, in which the circuit board 4 is accommodated in the conductive case 1 as bridge-supported by the conductive stands 5, the optical connector receptacle 6 projects from one side of the case, and the large number of connection terminals 13 and second grounding terminals 17 penetrate and project outward from the case.

Figure 4:
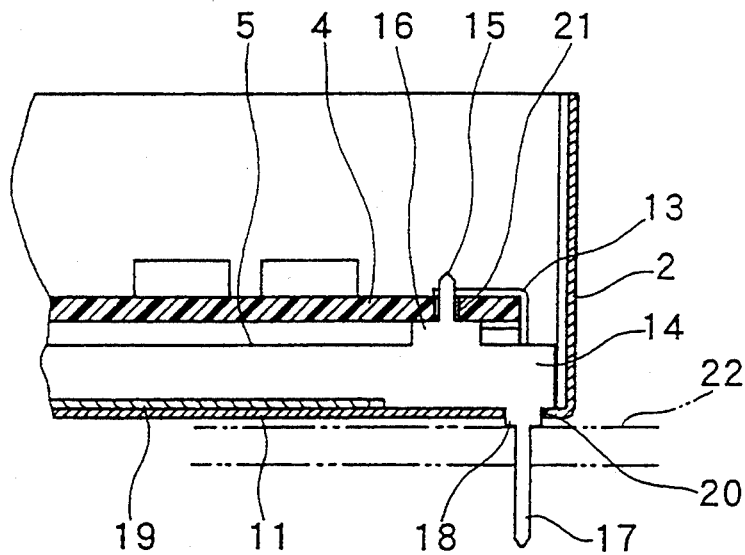
FIG. 4 is a fragmentary sectional view taken along line IV—IV in FIG. 3.
Figure 5:
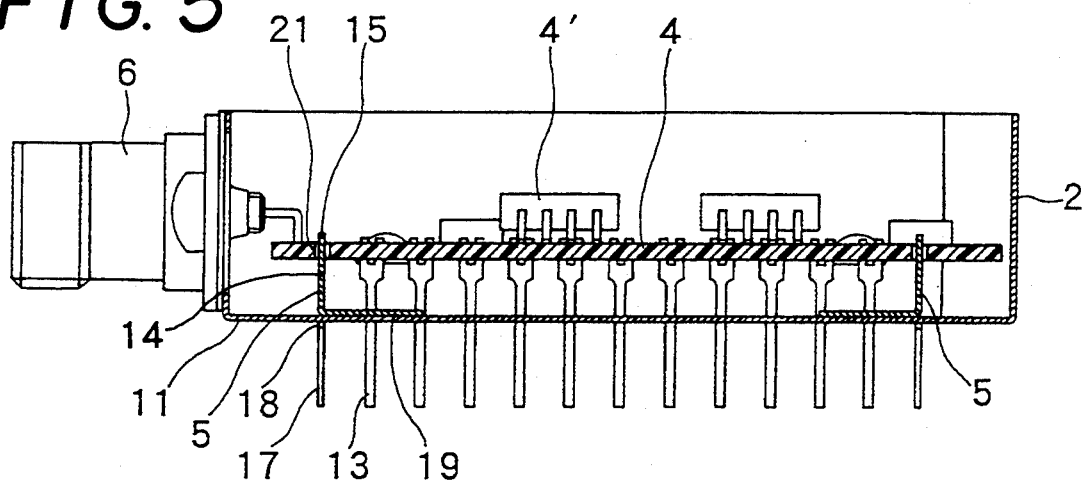
FIG. 5 is a sectional view taken along line V—V in FIG. 3.

As shown in FIG. 4, the connection terminals 13 projecting outward from the conductive case are inserted through through-holes in a mother board 22 (i.e., a wiring board) and soldered to the same. Also, the second grounding terminals 17 projecting outward from the conductive case 1 are inserted through through-holes in the mother board 22 and are soldered to grounding lines. Thus, the grounding lines of the circuit board 4 and the conductive case 1 are short-circuited to one another via the conductive stands 5. Further, the conductive case 1 connected to the mother board 22 forms an electrostatic shield to protect electronic components 4' of the photoelectric transducer circuit provided on the circuit board 4. In this case, when the second grounding terminals 17 are inserted, the stand-off portions 18 thereof are supported by the surface of the mother board 22 to form a gap between the bottom 11 of the accommodation case 2 and the mother board 22. The accommodation case 2 is thus spaced apart from the surface of the mother board 22.

FIGS. 8 to 12 show a different embodiment of the invention.

Figure 8:
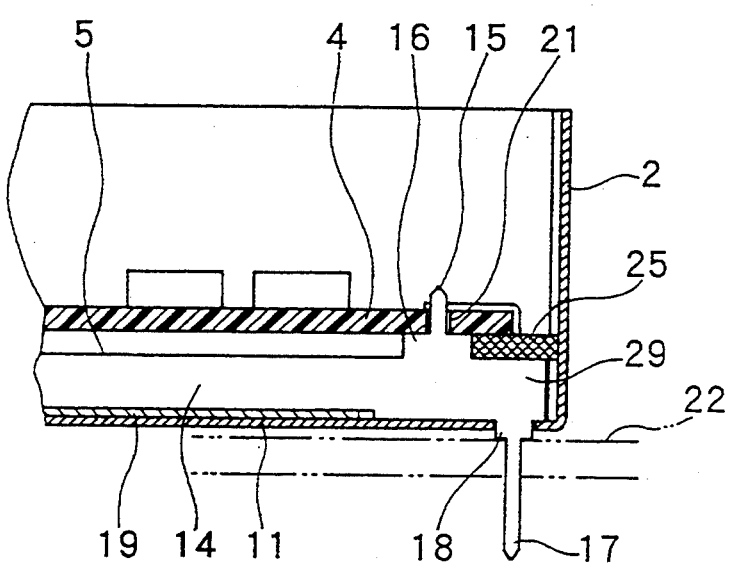
FIG. 8 is a view similar to FIG. 4 but showing a second embodiment of the invention.
Figure 9:
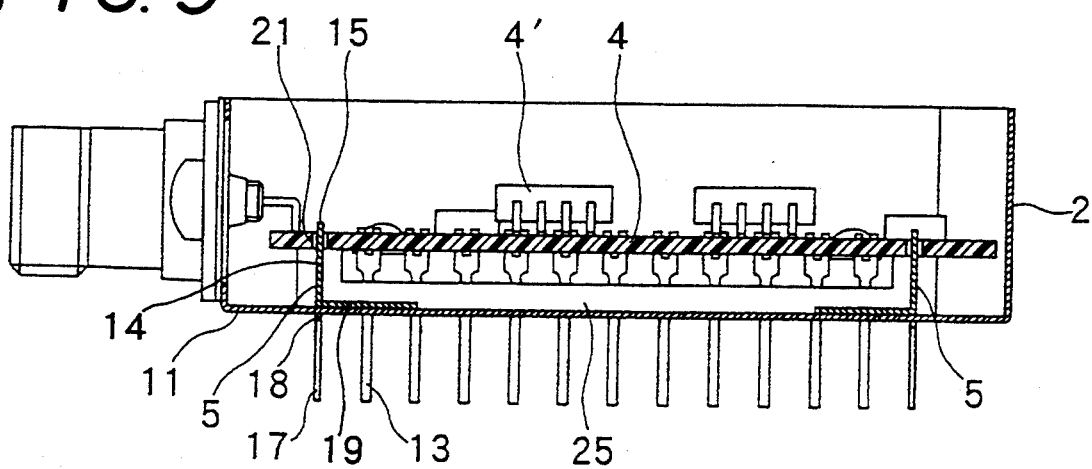
FIG. 9 is a view similar to FIG. 5 but showing the second embodiment with a circuit board accommodated and supported in an accommodation case.
Figure 10:
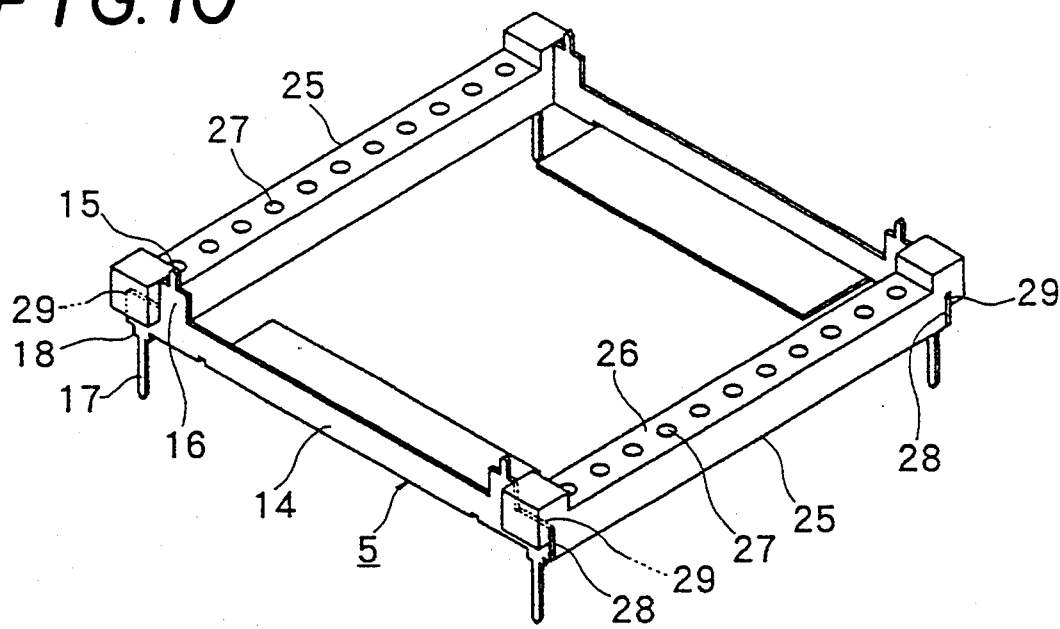
FIG. 10 is a perspective view showing conductive stands and a spacer mounted therein of the second embodiment.
Figure 11:
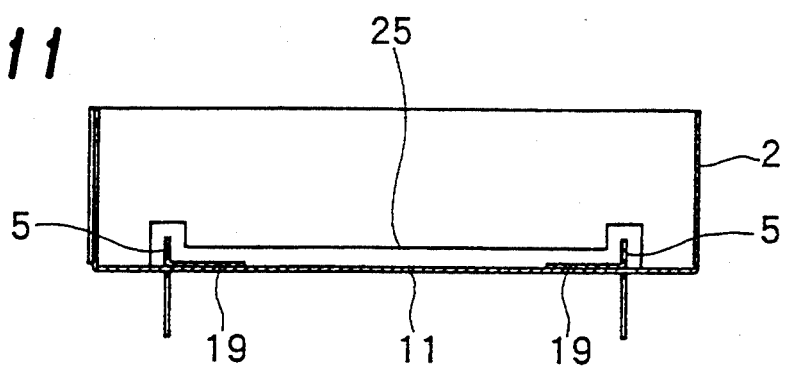
FIG. 11 is a fragmentary sectional view showing an accommodation case with the conductive stands and the spacer mounted therein of the second embodiment.

In this embodiment, as shown in FIGS. 8 and 9, an insulating spacer 25 is provided between the bottom 11 of the accommodation case 2 of the conductive case 1 and the circuit board 4. The spacer 25 comprises a pair of bar-like spacer members 26 having alignment holes 27, which are formed in correspondence to and at the same pitch as and are smaller in diameter than the terminal insertion holes 12. The stems of the connection terminals 13 of the circuit board 4 are inserted through the alignment holes 27. The spacer members 26 further have mounting grooves formed at the opposite ends and open downward. Further, like the previous embodiment, conductive stands 5 are disposed such that a connecting portion 14 of each stand 5 extends upright from bottom 11 of the case. Each conductive stand 5 also has two first grounding terminals 15 extending upward. Each first grounding terminal 15 is formed at a position spaced apart a certain distance from each end of the connecting portion 14 such as to form a mounting portion 29 between it and each end of the connecting portion 14. The pair of spacer members 26 are mounted and supported between the pair conductive stands 5 such that they are parallel to each other by fitting their mounting grooves 28 on the mounting portions 29.

Figure 12:
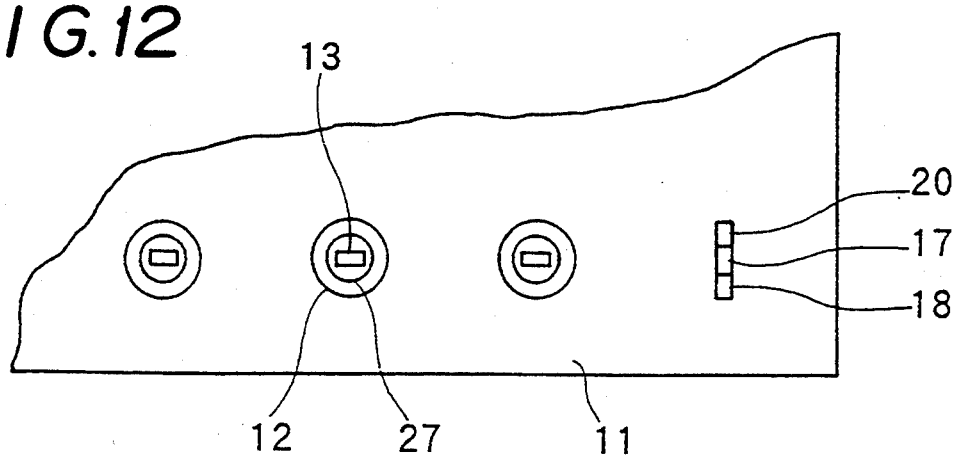
FIG. 12 is a fragmentary back view showing the accommodation case accommodating and supporting the circuit board of the second embodiment.
Figure 13:
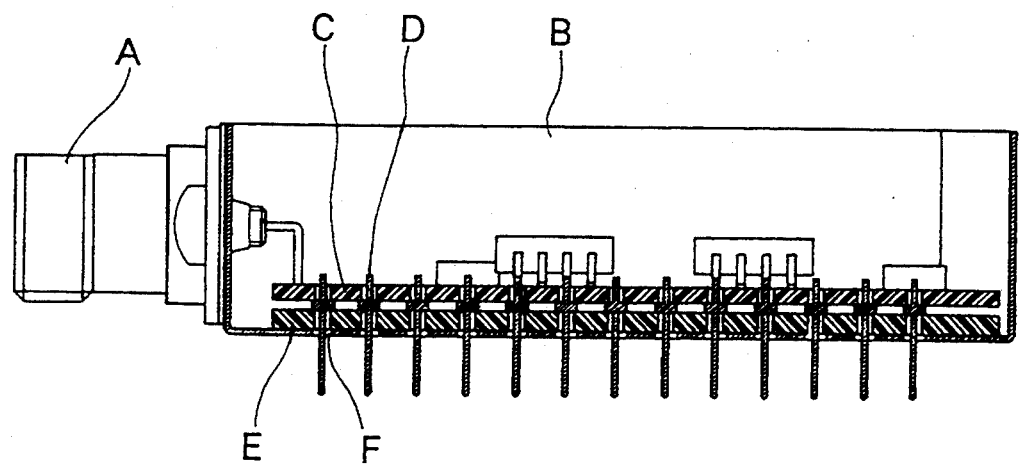
FIG. 13 is a sectional view showing a prior art photoelectric transducer.

Further, second grounding terminals 17 and stand-off portions 18, which extend from the opposite ends of the connecting portions 14 of the conductive stands 5, are inserted through stand mounting holes 20 formed in the bottom 11 of the case. Also, mounting portions 19 of the conductive stands 5 are bonded to the bottom 11 of the case, and the underside of each of the spacer members 26 is bonded to the bottom 11 of the case. Thus, as shown in FIG. 12, the alignment holes 27, which have a smaller diameter than the terminal insertion holes 12 formed in the accommodation case 2, are set to be concentric with the holes 12 to effectively prevent the contact of the connection terminals 13, which penetrate the alignment holes 27, with the edges of the case 2 defining the terminal insertion holes 12.

The above embodiments have opposite end portions of the pair conductive stands 5 provided with the first grounding terminals 15 so as to support the circuit board 4 by four-point support. According to the invention, however, it is also possible to use four conductive stands each having a first and a second grounding terminal 15 and 17 for bridge-supporting the circuit board 4 at the four corners thereof.

Further, it is possible to connect the opposite ends of the pair conductive stands 5 to one another to form a box-like frame or to connect the pair conductive stands 5 at only one end of each of them to form a channel-shaped frame.

The conductive stands 5 may be cast or formed by cutting metal sheet.

As has been described in the foregoing, according to the invention the conductive stands which bridge-support the circuit board, are adequately erected from the case bottom at predetermined positions thereof by inserting their second grounding terminals through the conductive case holes for outward projection, while the first grounding terminals are connected to the grounding lines of the circuit board. Thus, it is possible to readily obtain the grounding and assembling by positioning.

Further, with the circuit board bridge-supported on the conductive stands erected from the bottom of the conductive case, it is possible to effectively prevent positional deviation of the circuit board and ensure that the connection terminals provided on the circuit board are out of contact with the conductive case in coping with the size reduction of the photoelectric transducer adequately.

With the second grounding terminals of the conductive stands, which are inserted through the conductive case holes for outward projection, connected to the grounding lines of the external wiring board, the grounding lines of the external wiring board and the conductive case are grounded via the conductive stands, and it is thus possible to simplify the assembling by positioning and also readily form a shield structure.

Moreover, with the insulating spacer, which is provided between the circuit board and the conductive case, mounted and supported between the pair conductive stands, the spacer can be positioned reliably by the erected conductive stands, and the connection terminals of the circuit board can be aligned reliably with the alignment holes provided in the spacer, while permitting more reliable prevention of the contact of the connection terminals and the conductive case with one another.

What is claimed is:

1. A photoelectric transducer comprising: a conductive case; an optical connector receptacle integral with said case; a circuit board forming a photoelectric transducer circuit and grounding lines, said circuit board being accommodated in said conductive case and having connection terminals pentrating said conductive case so as to project outwardly from said case; and conductive stand means for bridge-supporting said circuit board, at opposite ends of said circuit board, above the bottom of said conductive case, said conductive stand means having first grounding terminals connected to the grounding lines of said circuit board, said conductive stand means also having second grounding terminals penetrating said conductive case so as to project outwardly from said case.

2. The photoelectric transducer according to claim 1, wherein said conductive stand means comprises a pair of conductive stands, and which transducer further comprises an insulating spacer provided between said circuit board and said conductive case, said spacer being mounted and supported between said conductive stands, said spacer having alignment holes penetrated by said connection terminals of said circuit board.

* * * * *